United States Patent [19]

Partridge et al.

[11] Patent Number: 5,757,201
[45] Date of Patent: May 26, 1998

[54] UNIVERSAL TESTING DEVICE FOR ELECTRONIC MODULES WITH DIFFERENT CONFIGURATIONS AND OPERATING PARAMETERS

[75] Inventors: Frank E. Partridge; Steve Loisate. both of Boise, Id.

[73] Assignee: Micron Electronics, Inc., Nampa, Id.

[21] Appl. No.: 712,371

[22] Filed: Sep. 11, 1996

[51] Int. Cl.$^6$ ................................................. G01R 31/02
[52] U.S. Cl. ................................................. 324/755
[58] Field of Search ............................... 324/754, 755, 324/757, 761, 765

[56] References Cited

U.S. PATENT DOCUMENTS

| | | | |
|---|---|---|---|
| 4,038,599 | 7/1977 | Bove et al. | 324/754 |
| 4,230,985 | 10/1980 | Matrone et al. | 324/755 |
| 4,443,756 | 4/1984 | Lightbody et al. | 324/761 |
| 4,977,370 | 12/1990 | Andrews | 324/761 |
| 5,434,513 | 7/1995 | Fujii et al. | 324/765 |
| 5,519,331 | 5/1996 | Cowart et al. | 324/755 |
| 5,635,846 | 6/1997 | Beaman et al. | 324/754 |

*Primary Examiner*—Ernest F. Karlsen
*Assistant Examiner*—Russell M. Kobert
*Attorney, Agent, or Firm*—Seed and Berry LLP

[57] ABSTRACT

A universal testing device for testing a plurality of electronic modules having different configurations and operating parameters. In one embodiment of the invention, a universal mounting board for testing a plurality of different modules with different pin configurations and operating parameters is a printed circuit board with a plurality of connectors and a plurality of conductive contact sites. The connectors of the universal mounting board are arranged to be operatively coupled with a plurality of contacts of a separate control fixture. In general, the contacts of the control fixture are operatively coupled to a supply voltage, a ground plane, and a signal controller. The control fixture also has a sufficient number of contacts to provide the necessary number of inputs/outputs of supply voltage, ground connections, and signals for virtually any type of electronic module. Also, the conductive contact sites of the universal mounting board may be operatively coupled with pins from a plurality of different modules because the universal mounting board has a sufficient number of conductive contact sites to configure the mounting board to provide the necessary number of inputs/outputs to the pins of different types of modules. The universal mounting board is configured to test a specific module with a specific pin configuration by coupling selected conductive sites to selected connectors. In operation, the mounting board may be releasably coupled to the control fixture so that the connectors on the mounting board are operatively coupled to the contacts of the control fixture. To test the specific modules, the signal controller and the module communicate with each other via the control fixture and the universal mounting board.

8 Claims, 5 Drawing Sheets

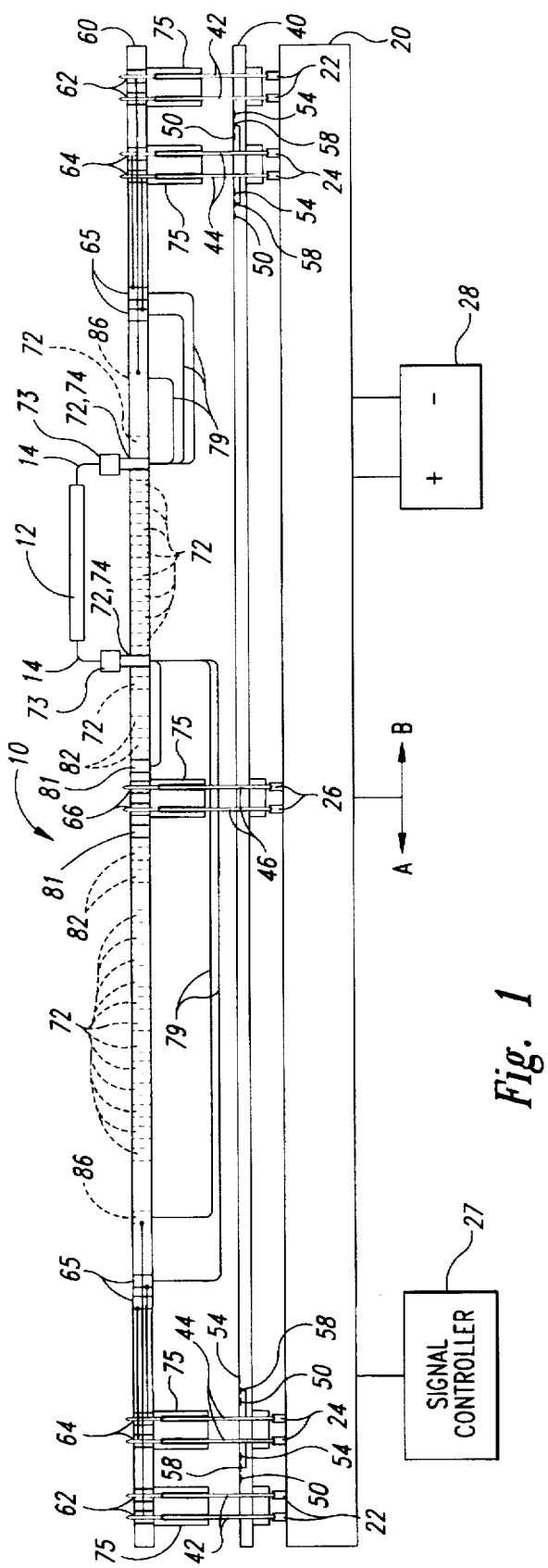
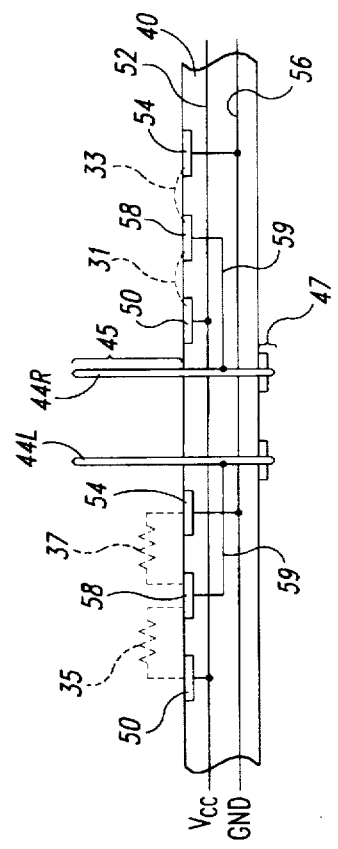
Fig. 1
Fig. 4

UNIVERSAL TESTING DEVICE FOR ELECTRONIC MODULES WITH DIFFERENT CONFIGURATIONS AND OPERATING PARAMETERS

TECHNICAL FIELD

The present invention relates to testing electronic modules, and more specifically, to a universal testing device for testing a plurality of electronic modules having different configurations and operating parameters.

BACKGROUND OF THE INVENTION

Electric modules are used in many devices and machines including computers, televisions, audio equipment, video equipment and many other consumer and industrial products. Common electric modules include memory devices, processors, displays, and other microelectronic devices. Many electronic modules are ultra-high density integrated circuits having a number of contact pins operatively coupled to the integrated circuits. The contact pins may be attached to a printed circuit board or other mounting device to be coupled to signal sources supply voltages and ground.

Electronic modules must be tested to ensure that they work for their intended purposes because they have extremely complex circuits. However, the circuitry and the operating parameters of one specific type of electronic module are generally different from that of other types of electronic modules. Therefore, tests for electronic modules must adapt to many different configurations of contact pins and operating parameters.

Conventional module testing equipment includes a signal controller and a test head to which an electronic module may be mounted for testing. The test head is operatively coupled to the signal controller so that a supply voltage, a ground connection, and signals are provided to the module. Because the operating parameters and the configuration of pins differs from one module to another, conventional test heads also differ from one test head to another to operatively couple the different types of modules to a signal controller, power supply, and ground connection. Thus, each test head must be specifically designed and manufactured for each specific type of electronic module.

One problem with conventional module testing equipment is that conventional test heads are expensive to manufacture. A large number of identical modules may be tested on a single test head, and thus only a small number of test heads are required to test a specific type of module. As a result, conventional test heads commonly have a significant amount of hand-wired circuitry because it is not economical to produce printed circuit boards for the small number of test heads needed to test a specific type of module. Moreover, developing test heads to test module prototypes is very expensive because prototypes often change throughout the development process and a different test head may be required for each new prototype. Making complex test heads with hand-wired circuitry, however, is time-consuming and extremely labor intensive. Therefore, current test heads are expensive and they increase the cost of developing and manufacturing electronic modules.

Moreover, since modules must be tested at the prototype stage, it is necessary to provide test fixtures of varying configurations throughout the development process. As discussed above, designing and constructing the handwired circuitry for each test head is very time-consuming, so it is often difficult to obtain a specific test head at desired times in the research and development process. Therefore, the need to obtain and revise conventional test heads often delays the development of new modules.

Still another problem of conventional testing equipment is that conventional test heads may produce noise that may interfere with a test. Because conventional test heads use hand-wired circuitry, long lengths of wire are generally required to construct the circuits. In general, longer wire lengths produce more noise and cause larger signal losses than shorter wire lengths. Therefore, conventional test heads may produce noise and cause signal losses.

In light of the problems with conventional module testing equipment, it would be desirable to develop a testing fixture that is less expensive, relatively easy to construct, and produces less noise and signal losses than conventional module testing equipment.

SUMMARY OF THE INVENTION

The present invention is a universal testing device for testing a plurality of electronic modules having different configurations and operating parameters. In one embodiment of the invention, a universal mounting board for testing a plurality of different modules with different pin configurations and operating parameters is a printed circuit board with a plurality of connectors and a plurality of conductive contact sites. The connectors of the universal mounting board are arranged to be operatively coupled with a plurality of contacts of a separate control fixture. In general, the contacts of the control fixture are operatively coupled to a supply voltage, ground, and a signal controller that is preferably both a signal source and a signal measuring device. The control fixture also has a sufficient number of contacts to provide the necessary number of inputs/outputs of supply voltage, ground connections, and signals for virtually any type of electronic module. Also, the conductive contact sites of the universal mounting board may be operatively coupled with pins from a plurality of different modules because the universal mounting board has a sufficient number of conductive contact sites to configure the mounting board to provide the necessary number of inputs/outputs to the pins of different types of modules.

The universal mounting board is configured to test a specific module with a specific pin configuration by coupling selected conductive sites to selected connectors. In operation, the mounting board may be releasably coupled to the control fixture so that the connectors on the mounting board are operatively coupled to the contacts of the control fixture. To test the specific modules, the signal controller and the module communicate with each other via the control fixture and the universal mounting board.

In a preferred embodiment, a removable intermediate board is positioned between the control fixture and the universal mounting board. The intermediate board preferably is a printed circuit board with a plurality of through pins extending through the board, a ground plane, and a voltage plane. The through pins are preferably arranged to couple the contacts on the control fixture to the connectors on the mounting board. The intermediate board may also have a plurality of signal pads electrically coupled to the plurality of through pins, a ground site electrically coupled to the ground plane, and a voltage site coupled to the voltage plane. In operation, a through pin is pulled down or continuously grounded by connecting its corresponding signal pad to the ground site, or it is pulled-up or continuously energized by connecting its corresponding signal pad to the voltage site. The intermediate board, therefore, provides the ability to selectively configure the inputs to the connectors of the universal mounting board.

In another embodiment of the invention, a sacrifice board is removably attached to the universal mounting board. The sacrifice board preferably has conductive pegs engaged with the selected contact sites on the universal mounting board and a plurality of pin receivers arranged in a pattern to receive the pins of the specific module. In operation, the pins of the specific module are coupled to the desired and power, ground, and signal sources of the control fixture through the sacrifice board and the universal mounting board.

BRIEF DESCRIPTION OF THE DRAWINGS

FIG. 1 is a schematic side view of an embodiment of a universal testing system in accordance with the invention.

FIG. 4 is a partial schematic cross-sectional view of an intermediate board of an embodiment of a universal testing system in accordance with the invention.

DETAILED DESCRIPTION OF THE INVENTION

Figure 2:
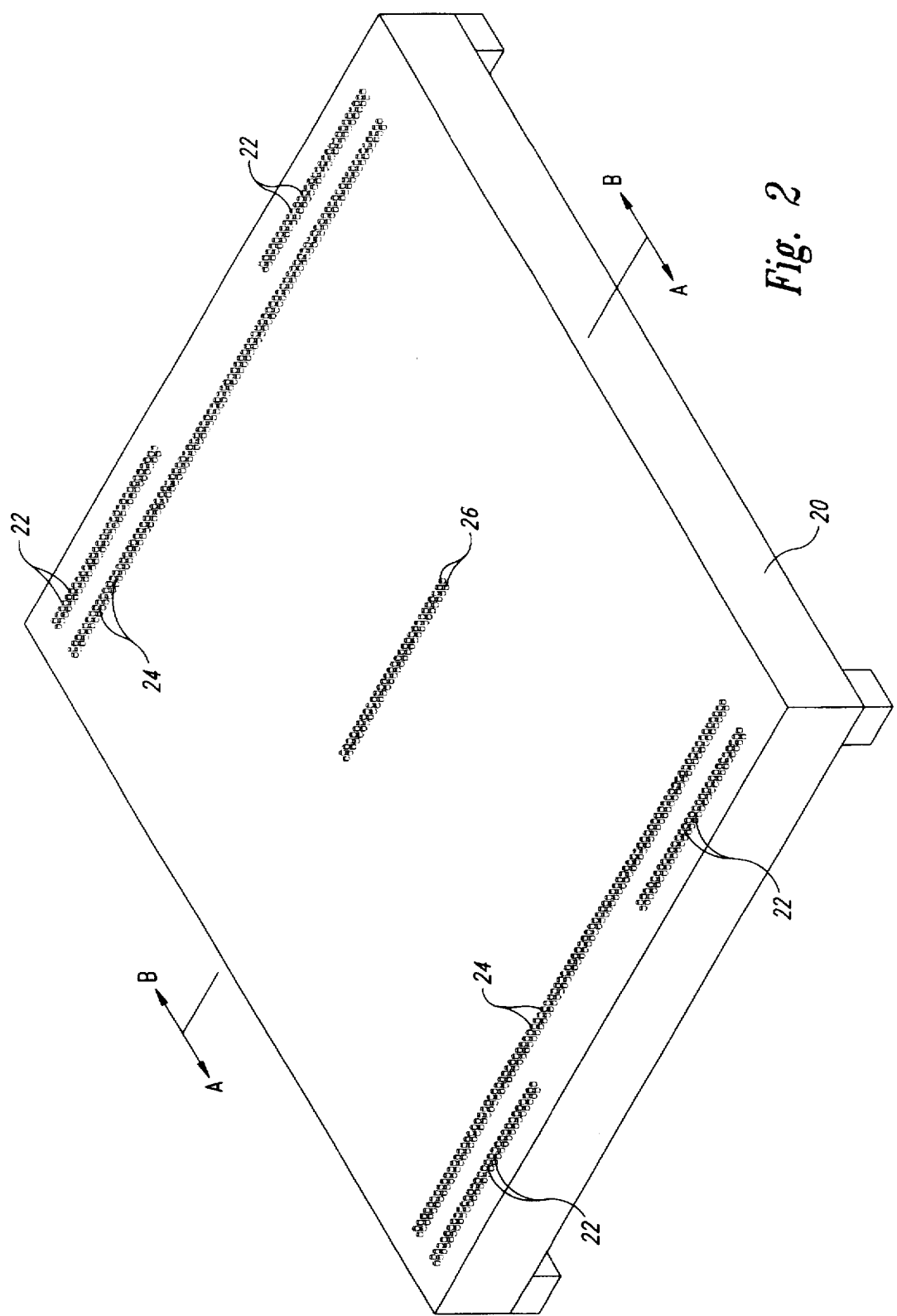
FIG. 2 is an isometric view of a control fixture of an embodiment of a universal testing system in accordance with the invention.

The present invention is a universal testing device for testing a plurality of electronic modules having different configurations, circuits, and operating parameters. A central concept of an embodiment of the invention is to mass-produce common boards and fixtures with circuitry that may be used to test virtually any module configuration, and to provide areas on the mass-produced items to construct a small amount of specific circuitry to adapt the mass-produced items to test specific modules. One important aspect of an embodiment of the invention is to provide a control fixture with a large number of power, ground and signal contacts that may be operatively connected to a signal controller and a power supply. The number of power, ground and signal contacts is generally sufficient to provide the necessary resources to test virtually any type of module. Another important aspect of an embodiment of the present invention is to provide a universal mounting board with a sufficient number of connectors and conductive contact sites to accommodate many different modules. The connectors of the universal mounting board are preferably arranged to be operatively coupled to the power, ground and signal contacts of the control fixture. FIGS. 1–6, in which like reference numbers refer to like parts throughout the various figures, illustrate an embodiment of a universal testing system in accordance with the invention.

FIG. 1 schematically illustrates an embodiment of a universal testing system 10 in accordance with the invention for testing a plurality of electronic modules having different configurations. In this embodiment, the testing system 10 preferably has a control fixture 20, an intermediate board 40 releasably attached to the control fixture 20, and a universal mounting board 60 releasably attached to the intermediate board 40. The control fixture 20 has a plurality of contacts 22, 24 and 26 that are operatively coupled to either a signal controller 27 or voltage supply/ground terminals of a power supply 28. The signal controller 27 is preferably both a signal source to generate signals for the module and a signal measuring device to measure response signals from the module. Suitable signal controllers 27 include any computer and software such as those used to operate conventional HP-3070 test heads used by Hewlett Packard Company of Calif.

The intermediate board 40 has a plurality of through pins 42, 44 and 46 that are operatively coupled to contacts 22, 24 and 26 of the control fixture 20 to selectively carry signal, voltage, and ground inputs/outputs from the control fixture 20 to the universal mounting board 60. As discussed in greater detail below, the through pins 44 of the intermediate board 40 may be individually coupled to supply voltage pads 50 or ground pads 54 to further control the electrical characteristics of the pins 44.

The universal mounting board 60 has a plurality of connectors 62, 64 and 66 coupled with the through pins 42, 44 and 46 of the intermediate board 40 via sockets 75, and the universal mounting board 60 has a plurality of conductive contact sites 72 to which the pins 14 of a module 12 are operatively coupled. The number of conductive contact sites 72 is generally greater than the number of signal, power and ground sources necessary to couple different types of modules to the testing system 10. To adapt the testing system 10 to test a specific module 12, the pins 14 of the module 12 are preferably mounted to sockets 73 at selected conductive contact sites 74 of the plurality of conductive sites 72. The selected conductive sites 74 are also operatively coupled to selected connectors 62, 64 and 66 with circuitry 79 specific to the specific module 12 to operatively couple the pins 14 of the module 12 to appropriate voltage supply, ground, and signal sources. Particular embodiments of the control fixture 20, intermediate board 40, and universal mounting board 60 are described in further detail below.

FIG. 2 illustrates one embodiment of control fixture 20 in greater detail. The connectors 22, 24 and 28 are preferably pogo-point connectors that are biased upwardly with respect to the control fixture 20. The contacts 22 are primarily power and ground sources that are coupled to the power supply 28 (shown in FIG. 1), but some of the contacts 22 may be coupled to the signal controller 27 (also shown in FIG. 1). The ground and power contacts of contacts 22 are preferably connected to ground and power planes (not shown) in the control fixture 20 to reduce noise and signal loss in the control fixture 20. The contacts 24 and 26 are primarily coupled to the signal controller 27 to provide signal sources to the module 12. The control fixture 20 is preferably divided into two separate operating halves A and B, in which each half has two sets of electrical contacts 22 and one long set of contacts 24. The operating halves A and B are preferably identical so that two or more modules may be tested simultaneously with the same control fixture 20.

Referring to FIGS. 1 and 2 together, the signal controller 27 sends and receives test signals via selected contacts 22, 24 and 26 according to the specific configuration and operating parameters of the module 12. To adapt the control fixture 20 so that virtually any number of different module configurations may be tested with the same control fixture 20, the control fixture 20 has a sufficient number of electrical contacts 22, 24, and 26 to provide the requisite power, ground, and signal sources for virtually any type of module. It will be appreciated that many of the electrical contacts 22, 24 and 26 may not be used to test a specific electric module because the control fixture 20 has a number of extra connectors to accommodate modules that require more sources. Therefore, the control fixture 20 may be used to test a single module with a large number of pins, or several modules with a relatively small number of pins.

Figure 3:
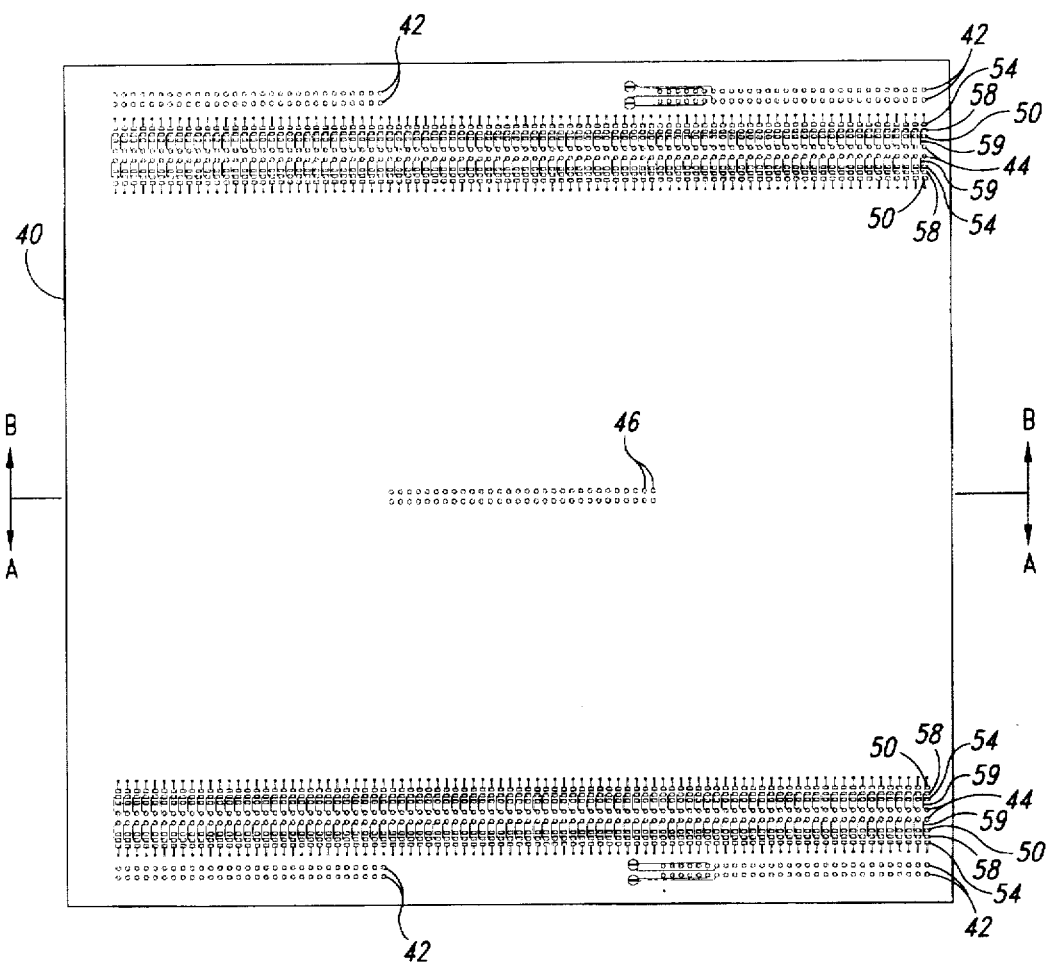
FIG. 3 is a circuit diagram of an intermediate board of an embodiment of a universal testing system in accordance with the invention.

FIGS. 3 and 4 illustrate the intermediate board 40 in greater detail. Referring to FIG. 3, the intermediate board 40 is preferably a printed circuit board in which the pins 42, 44 and 46 are arranged in a pattern to directly engage the contacts 22, 24 and 26 of the control fixture 20 (shown in FIG. 1) and the connectors 62, 64 and 66 of the universal mounting board 60 (also shown in FIG. 1). As shown in FIG. 4, the pins 42, 44 and 46 preferably have a relatively long upper section 45 and a relatively short lower section 47. The long upper sections 45 of the pins 42, 44 and 46 space the universal mounting board 60 from the intermediate board 40 so that individual wires and components may be positioned between the boards 40 and 60. In a preferred embodiment, a voltage pad 50, a ground pad 54, and a signal pad 58 are positioned proximate to each of the pins 44. The intermediate board 40 may have a plurality of voltage and ground pads 50 and 54 (as shown in FIG. 3), or a single voltage site (not shown) and a single ground site (not shown) may be positioned on the board 40. As best shown in FIG. 4, the voltage pads 50 are connected to a supply voltage plane 52, the ground pads 54 are connected to a ground plane 56, and the signal pads 58 are individually connected to corresponding pins 44 by lines 59. The pins 44 are electrically isolated from the supply voltage and ground planes 52 and 56.

Still referring to FIG. 4, each pin 44 may be selectively coupled to its corresponding voltage pad 50 or ground pad 54 to individually control the characteristics of each pin 44. For example, one pin 44R may be directly coupled to the supply voltage plane 52 by a line 31 connected to the voltage pad 50 and the signal pad 58, or it may be connected to the ground plane 56 by a line 33 connected to the ground pad 54 and the signal pad 58. Additionally, another pin 44 L may be pulled-up by connecting a resistor 35 to the voltage pad 50 and the signal pad 58, or it may be pulled-down by connecting a resistor 37 to the ground pad 54 and the signal pad 58.

The intermediate board is preferably separate from the control fixture 20 and the universal mounting board 60 (as shown in FIG. 1), to provide a plurality of voltage pads 50 and ground pads 54 that may be selectively coupled to the pins 44 to specifically configure the intermediate board 40 into a desired configuration. In another embodiment of a separate intermediate board (not shown), a portion of the through pins are preconnected to the supply voltage and ground planes, and all of the through pins are arranged in a pattern of pin groups. For example, each group of pins in the pattern may have a first pin coupled to the supply voltage plane, a second pin coupled to the ground plane, a third pin coupled to the supply voltage plane via a pull-up resistor, a fourth pin coupled to the ground plane via a pull-down resistor, and a fifth pin coupled only to a signal source. The number of such pin groupings is preferably sufficient to provide the requisite number of signal, voltage, ground, pull-up, and pull-down pins to test a number of different modules.

In still another embodiment of the invention (not shown), the structure and function of the intermediate board 40 may be integrated with the control fixture 20 of FIG. 2 such that the contacts 22, 24 and 26 of the control fixture 20 may be selectively coupled to supply voltage and ground planes. In this embodiment, the universal mounting board 60 (shown in FIG. 1) is mounted directly onto the control fixture 20 so that the module being tested is coupled to the necessary signal, voltage, ground, pull-up, and pull-down sources. Similarly, in yet another embodiment (not shown), the structure of the intermediate board 40 may be integrated with the universal mounting board 60 so that the connectors 62, 64 and 66 of the universal mounting board 60 may be selectively coupled to supply voltage and ground planes. In this embodiment of the invention, the connectors of the universal mounting board (not shown) are pins that engage the contacts 22, 24 and 26 of the control fixture 20. Therefore, the invention is not limited to the intermediate board 40 shown in FIGS. 3 and 4.

Figure 5:
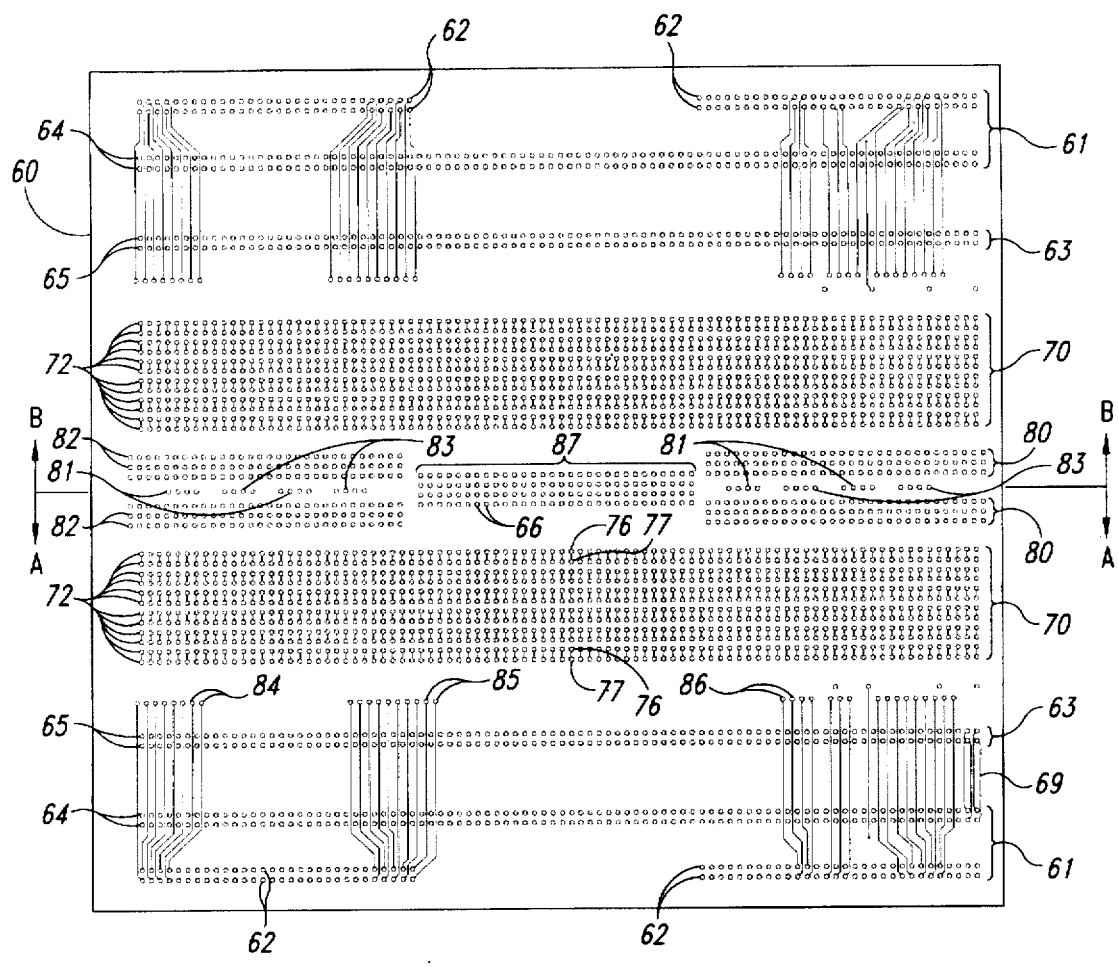
FIG. 5 is a top view of a universal mounting board of an embodiment of a universal testing system in accordance with the invention.

FIG. 5 illustrates a top view of the universal mounting board 60 with a plurality of resource regions 61, a number of interface regions 63, and a number of mounting regions 70. Each resource region 61 has a plurality of supply connectors 62 and resource connectors 64, each interface region 63 has a plurality of interface points 65, and each mounting region 70 has a plurality of conductive contact sites 72. The supply connectors 62, resource connectors 64, interface points 65, and conductive sites 72 are preferably oversized vias that receive pins and/or sockets (not shown) to attach the universal mounting board 60 to the intermediate board 40 (shown in FIG. 1), or to attach a module (not shown) to the universal mounting board 60. In a preferred embodiment, the universal mounting board 60 also has device regions 80 with a plurality of device sites 82, a central resource region 87 with a plurality of additional connectors 66, and a number of ground sites 81 and supply voltage sites 83. The device sites 82 provide locations to which a particular device, such as a processing module (not shown), may be mounted to perform tests on the module being tested (not shown), and the ground sites 81 and voltage sites 83 provide more ground and voltage sources for modules or other devices.

The universal mounting board 60 is preferably divided into two separate halves, A and B, in which each half has a resource region 61, an interface region 63, and a mounting region 70. A few of the supply connectors 62 of each resource region 61 are connected to either an X-bus via 84, a GP relay via 85, or an L/G via 86 by printed circuitry within the universal mounting board 60. Similarly, several other supply connectors 62 are preferably power and ground sources that may be hand wired to conductive contact sites 72, ground sites 81, or voltage sites 83. The resource connectors 64 are connected to corresponding interface points 65 by printed lines 69 in the universal mounting board 60. Each resource connector 64 is preferably connected to a single corresponding interface point 65. The interface points 65 are preferably spaced away from the supply connectors 64 so that wires (not shown) may be easily soldered into the vias of the interface points 65 without interfering with any of the pins 44 attached to the supply connectors 64. The interface points 65 accordingly make it easier to wire the conductive contact sites 72 to the resource connectors 64.

In a preferred embodiment, the conductive contact sites 72 are preferably rows of socket vias 76 and wire vias 77. Each socket via 76 is coupled to a wire via 77 so that a socket (not shown) may be soldered into a socket via 76 and a wire (not shown) may be more easily coupled to the socket by being soldered to the corresponding wire via 77.

Figure 6:
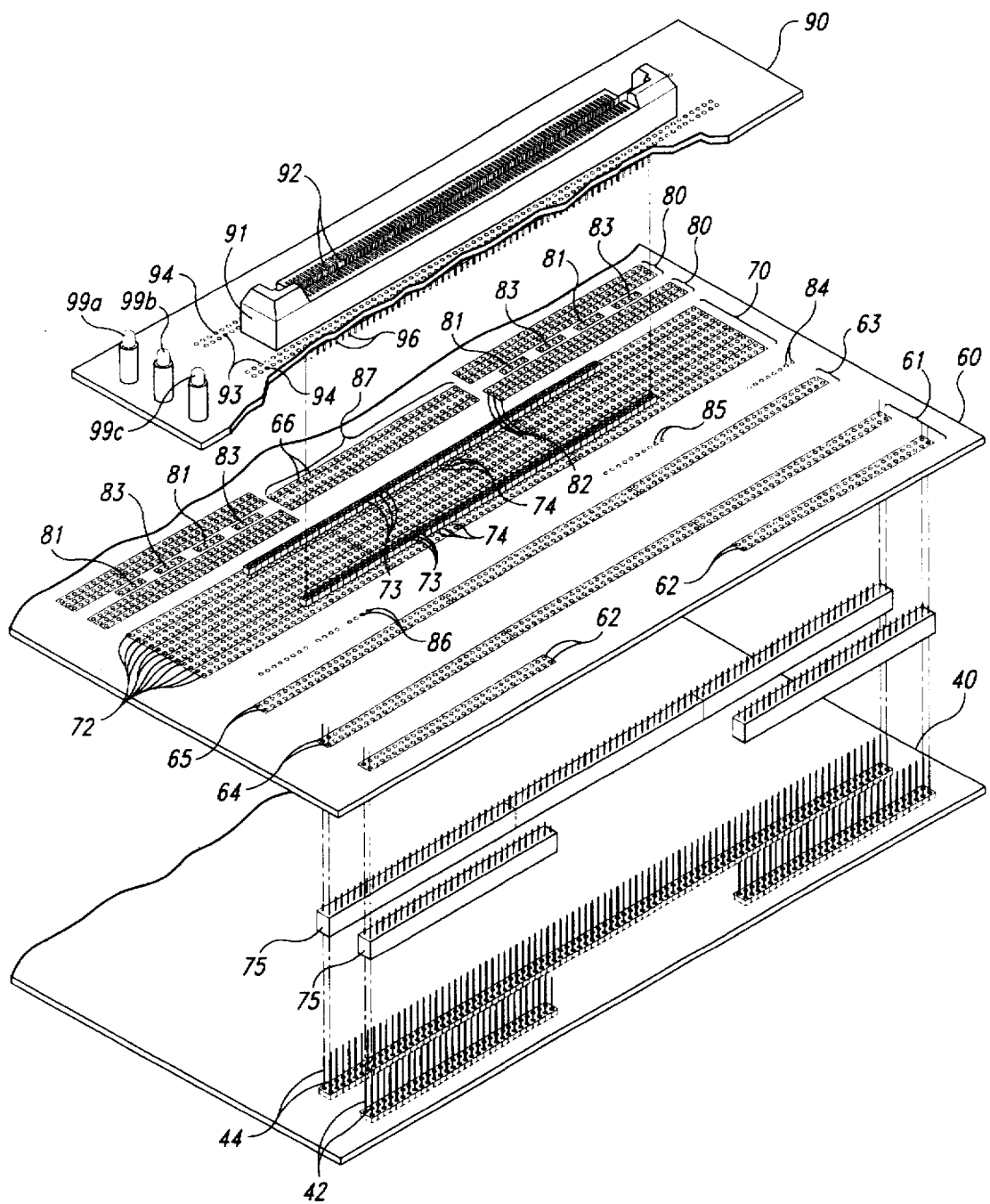
FIG. 6 is a schematic isometric view of a portion of a universal testing system in accordance with the invention.

FIG. 6 further illustrates the relationship between the universal mounting board 60, the intermediate board 40, and the control fixture 20. To adapt the universal mounting board 60 to receive and test a particular module (not shown), a number of sockets 73 are attached to selected conductive contact sites 74 of the plurality of conductive contact sites 72. When the module is to be mounted directly to the sockets 73, the selected contact sites 74 are positioned to receive the pins (not shown) of the specific module being tested. It will be appreciated that the plurality of conductive contact sites 72 are generally formed in a large matrix in the work regions 70 so that all of the pins of virtually any module may be aligned with a socket 73 in a conductive contact site 72. The selected contact sites 74 are accordingly those conductive contact sites 72 aligned with the pins of the specific module. Each socket 73 in a selected contact site 74 is then hand wired to either an interface point 65, a ground site 81, a voltage site 83, an X-bus site 84, a GP relay site 85, or an L/G site 86. A particular socket 73 is wired to a particular site according to the input and/or output of the pin engaged with the particular socket 73. Large block sockets 75 are also preferably attached to the supply connectors 62 and resource connectors 64 to couple the pins 42, 44 and 46 of the intermediate board 40 to the connectors 62, 64 and 66 of the universal mounting board 60.

Referring to FIGS. 1 and 6 together, the testing device 10 operates by configuring the universal mounting board 60 to receive a specific module 12. After the sockets 73 are positioned in socket vias 76 corresponding to selected conductive contact sites 74, wires 79 are soldered between the corresponding wire vias 77 and either the supply connectors 62, the interface points 65, the ground sites 81, the voltage sites 83, the X-bus sites 84, the GP relay sites 85, and the L/G sites 86. The universal mounting board 60 is then mounted to the intermediate board 40 by inserting the through pins 42, 44 and 46 into sockets 75 attached to the connectors 62, 64 and 66. As discussed above with respect to FIGS. 3 and 4, the intermediate board 40 is preferably configured to provide the appropriate supply voltage, ground connections, and signals to the universal mounting board 60. The intermediate board 40 is then positioned on the control fixture 20 so that the through pins 42, 44, and 46 contact the electrical contacts 22, 24, and 26 of the control fixture 20. The signal controller 27 and power supply 28 operate to test the module 12 through the testing device 10 by sending signals to the module 12 and analyzing response signals from the module 12. If the module 12 passes, it is simply removed from the sockets 73 of the universal mounting board 60, and another identical module is mounted to the universal mounting board 60 for testing.

One advantage of the present invention is that the testing device 10 is less expensive to manufacture compared to conventional test heads. Unlike conventional module testing equipment, a significant portion of the universal testing device of the invention may be mass-produced in printed circuit boards. The mass-production of most of the circuitry is made possible by providing a universal mounting board with a sufficient number of conductive contact sites to receive the pins of a plurality of different modules, and by providing a sufficient number of signal, supply voltage, and ground resources to connectors on the universal mounting board 60. Thus, to test a specific module, it will be appreciated that the only circuitry that must be designed and manually assembled in the present invention is the circuitry that connects the selected conductive contact sites to the selective connectors on the universal mounting board 60. In a preferred embodiment, additional advantages of the universal testing device are further realized by providing an intermediate board with a plurality of through pins that may be selectively coupled to either the supply voltage plane or a ground terminal plane. Therefore, the bulk of the universal testing device of the present invention may be mass-produced in a cost effective manner by producing identical control fixtures, intermediate boards, and universal mounting boards that may be readily configured to test a specific module.

Another advantage of the present invention is that the universal testing device may be quickly configured to test a specific module. Because a significant portion of the universal testing device of the present invention is mass-produced on printed circuit boards, it is generally much faster to manually wire the small amount of circuitry on the universal mounting board than it is to wire an entire test head of a conventional device. Therefore, the universal testing device of the present invention may be quickly assembled to avoid delaying the development of new module prototypes.

Still another advantage of the present invention is that the testing device of the invention typically produces less noise and signal loss than conventional testing equipment. Because a majority of the wiring in the present invention is printed on PCBs, the intermediate board 40 and the universal mounting board 60 have relatively short lengths of wire compared to the significant amount of hand-wired circuitry of conventional test heads. Moreover, each of the control fixture 20, intermediate board 40, and the universal mounting board 60 preferably have separate ground and voltage planes to further reduce noise in the system. Therefore, the universal testing device of the present invention generally produces less noise and causes less signal loss than conventional test heads.

Referring again to FIG. 6, a sacrifice board 90 is preferably mounted to the sockets 73 in the selected conductive contact sites 74 on the universal mounting board 60. The sacrifice board 90 preferably has a module mounting block 91 with a plurality of pin receivers 92 into which the pins (not shown) of a specific module (not shown) are positioned in a testing position. Each of the pin receivers 92 is coupled to a first via 93, and each of the first vias 93 is coupled to a second via 94. A number of pegs 96 are coupled to selected second vias 94 in a position to engage the sockets 73 in the selected conductive sites 74 of the universal mounting board 60. The sacrifice board 90 may also have a pass indicator 99a, a run indicator 99b, and a fail indicator 99c. The indicators 99a–99c are preferably lights that are operatively coupled to the signal controller 27 (shown in FIG. 1), which selectively illuminates one of the indicators 99a–99c according to the status of the test. In operation, the sacrifice board 90 connects the selected conductive sites 74 of the universal mounting board 60 to the pins of a module (not shown).

One advantage of the sacrifice board 90 is that the selected conductive contact sites 74 on the universal mounting board 60 do not need to be aligned with the pins of the module being tested. As a result, even modules with pins that do not align with conductive contact sites may be tested on the universal mounting board 60. Another advantage of the sacrifice board 90 is that the sockets 73 attached to the universal mounting board 60 last longer compared to sockets that directly engage the pins of the modules. The sockets 73 attached to the selected conductive contact sites 74 tend to wear out because inserting and removing the pins of several modules may cause the sockets to detach from the universal mounting board 60. The module mounting block 91 of the sacrifice board 90, on the other hand, is not removed from the sockets and it is easily replaced after it wears out. Therefore, it is generally more desirable to use a sacrifice board 90 to attach a specific module to the universal mounting board 60.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A universal testing device for testing a plurality of different electronic modules, comprising:

a control fixture having a plurality of electronic contacts, each contact being operatively coupled to one of a supply voltage source, a ground source, or a signal controller, wherein the signal controller sends and receives test signals via selected contacts according to a configuration and operating parameters of a specific module;

a universal mounting board having a plurality of resource connectors, a plurality of source connectors and a plurality of conductive contact sites, the conductive contact sites being arranged in a manner in which pins of a plurality of different modules having different pin configurations may be coupled to the universal mounting board, wherein the universal mounting board may be configured to test the specific module by coupling selected conductive sites to selected connectors, the selected conductive sites and the selected connectors corresponding to a specific pin configuration of the specific module so as to couple the pins of the specific module to desired power, ground, and signal sources; and a removably attachable intermediate board positioned between the control fixture and the universal mounting board, the intermediate board having:

a printed circuit board having a front side, a backside, a ground plane between the front and back sides, and a voltage plane between the front and back sides;

a plurality of through pins extending through the printed circuit board beyond the front and back sides, the through pins being electrically isolated from the voltage and ground planes and positioned to couple the contacts of the control fixture to the resource connectors and the supply connectors of the universal mounting board;

a plurality of signal pads electrically isolated from the voltage and ground planes, each signal pad being electrically coupled to a through pin;

a ground site electrically coupled to the ground plane and electrically isolated from the through pins and the voltage plane; and a voltage site electrically coupled to the voltage plane and electrically isolated from the through pins and the ground plane, wherein the intermediate board is selectively configured to place a particular conductive contact on the module mounting board in a known state by connecting a selected signal pad corresponding to a through pin coupled to the particular conductive contact to one of the ground site and the voltage site.

2. The universal testing device of claim 1, further comprising a sacrifice board removably attached to the universal mounting board, the sacrifice board having conductive pegs engaged with the selected contact sites and a module mounting block with a plurality of pin receivers that receive the pins of the specific module, wherein the pins of the specific module are coupled to desired power, ground, and signal sources through the sacrifice board and universal mounting board.

3. The universal testing device of claim 1, further comprising a sacrifice board removably attached to the universal mounting board, the sacrifice board having conductive pegs engaged with the selected contact sites and a module mounting block with a plurality of pin receivers that receive the pins of the specific module, wherein the pins of the specific module are coupled to desired power, ground, and signal sources through the intermediate board, the universal mounting board, and the sacrifice board.

4. The universal testing device of claim 1 wherein the universal mounting board is a printed circuit board with a front side and a backside, the connectors and the conductive contact sites comprising vias to which pins, wires, and conductive sockets may be attached.

5. The universal testing device of claim 1 wherein the conductive contact sites of the universal mounting board comprise a module mounting region in which the conductive contact sites are arranged in alternating rows of wire terminal vias and socket receiving vias, each wire terminal via being coupled to a socket receiving via.

6. The universal testing device of claim 1 wherein the plurality of resource connectors are located in a resource region on the universal mounting board and the plurality of supply connectors are located in a supply region, wherein the resource connectors and the supply connectors may be wired to the selected conductive contact sites of the universal mounting board to electrically couple the resource and the supply connectors to appropriate pins of the specific module.

7. The universal testing device of claim 1 wherein the universal mounting board further comprises an interface region having a plurality of interface connecting points coupled to corresponding resource connectors, wherein the signal controller provides signals to the interface connecting points via the resource connectors.

8. The universal testing device of claim 1 wherein the intermediate board further comprises:

a plurality of ground sites electrically coupled to the ground plane and electrically isolated from the through pins and the voltage plane, each ground site being positioned proximate to a corresponding signal pad; and a plurality of voltage sites electrically coupled to the voltage plane and electrically isolated from the through pins and the ground plane, wherein each voltage site is positioned proximate to a corresponding signal pad such that each signal pad is proximate to a ground site and a voltage site.

* * * * *